(12) United States Patent
Zenou

(10) Patent No.: US 12,226,953 B2
(45) Date of Patent: Feb. 18, 2025

(54) METHOD FOR TRANSFERRING A MATERIAL

(71) Applicant: GRANAT RESEARCH, LTD., Jerusalem (IL)

(72) Inventor: Michael Zenou, Hashmonaim (IL)

(73) Assignee: GRANAT RESEARCH, LTD., Jerusalem (IL)

( * ) Notice: Subject to any disclaimer, the term of this patent is extended or adjusted under 35 U.S.C. 154(b) by 478 days.

(21) Appl. No.: 17/310,411

(22) PCT Filed: Mar. 23, 2020

(86) PCT No.: PCT/IB2020/052703
§ 371 (c)(1),
(2) Date: Jul. 30, 2021

(87) PCT Pub. No.: WO2020/194167
PCT Pub. Date: Oct. 1, 2020

(65) Prior Publication Data
US 2022/0088854 A1 Mar. 24, 2022

Related U.S. Application Data

(60) Provisional application No. 62/823,087, filed on Mar. 25, 2019.

(51) Int. Cl.
*B29C 64/147* (2017.01)
*B23K 26/361* (2014.01)
(Continued)

(52) U.S. Cl.
CPC .......... *B29C 64/147* (2017.08); *B23K 26/361* (2015.10); *B29C 64/268* (2017.08); *B33Y 10/00* (2014.12); *B33Y 30/00* (2014.12)

(58) Field of Classification Search
CPC ... B23K 26/361; B29C 64/147; B29C 64/268; B32B 15/04; B33Y 10/00; B33Y 30/00;
(Continued)

(56) References Cited

U.S. PATENT DOCUMENTS 3,006,795 A 10/1961 Brickell
3,506,507 A 4/1970 Brietzke
(Continued)

FOREIGN PATENT DOCUMENTS

CN 106910678 A 6/2017
EP 0677985 A1 10/1995
(Continued)

OTHER PUBLICATIONS

Zenou; et al., "Digital laser printing of aluminum micro-structure on thermally sensitive substrates", Journal of Physics D: Applied Physics (2015), 48:205303 (12 pp).
(Continued)

*Primary Examiner* — Philip C Tucker
*Assistant Examiner* — Jimmy R Smith, Jr.
(74) *Attorney, Agent, or Firm* — Ascenda Law Group, PC

(57) ABSTRACT

Apparatus and methods for printing metal on a receiving substrate in a desired geometry using a foil pre-coated with a layer of material. The deposition process includes laser ablation to define desired material geometry, selective application of adhesive to the material to be deposited, and selective release of the material from a carrier substrate.

10 Claims, 11 Drawing Sheets

(51) Int. Cl.
  *B29C 64/268* (2017.01)
  *B33Y 10/00* (2015.01)
  *B33Y 30/00* (2015.01)

(58) Field of Classification Search
  CPC .. H05K 2203/107; H05K 3/027; H05K 3/046; H05K 3/20
  See application file for complete search history.

(56) References Cited

U.S. PATENT DOCUMENTS

| | | | | |
|---|---|---|---|---|
| 5,171,650 | A | * | 12/1992 | Ellis .................. G03F 3/108 430/278.1 |
| 2003/0022403 | A1 | * | 1/2003 | Shimoda .............. B82Y 30/00 257/E27.113 |
| 2003/0178227 | A1 | | 9/2003 | Matsunaga et al. |
| 2007/0064054 | A1 | * | 3/2007 | Hayden ............... H05K 3/0097 347/59 |
| 2017/0266728 | A1 | | 9/2017 | Johnson et al. |
| 2019/0014666 | A1 | * | 1/2019 | Bahl .................. H05K 3/0047 |

FOREIGN PATENT DOCUMENTS

| | | |
|---|---|---|
| EP | 3 219 412 A1 | 9/2017 |
| JP | 2004-306412 A | 11/2004 |
| JP | 2017-015859 A | 1/2017 |
| JP | 2017-028293 A | 2/2017 |
| KR | 20030041643 A | 5/2003 |
| KR | 10-2011-0080912 A | 7/2011 |
| WO | 03/010825 A1 | 2/2003 |
| WO | 2016/063270 A1 | 4/2016 |
| WO | 2016/198291 A1 | 12/2016 |

OTHER PUBLICATIONS

International Preliminary Report on Patentability mailed Oct. 7, 2021, from The International Bureau of WIPO, for International Patent Application No. PCT/IB2020/052703 (filed Mar. 23, 2020), 9 pgs.
International Search Report and Written Opinion mailed Jul. 2, 2020, from ISA/European Patent Office, for International Patent Application No. PCT/IB2020/052703, 29 pgs.
First Office Action issued Nov. 4, 2023, from The National Intellectual Property Administration of the People's Republic of China, for Chinese Patent Application No. 202080019576.6, 23 pages.
Notice of Preliminary Rejection dated Nov. 24, 2022, from the Korean Intellectual Property Office (KIPO), for Korean Patent Application No. 10-2021-7027871, 5 pgs.
Communication pursuant to Article 94(3) EPC dated Jan. 4, 2024, First exam report from the European Patent Office, for European Patent Application No. 20717282.6, 5 pgs.
Office Action dated Sep. 28, 2023, from the Japan Patent Office, for Japanese Patent Application No. 2022-504746, 7 pgs.
Final Rejection dated Mar. 18, 2024, from the Japan Patent Office, for Japanese Patent Application No. 2022-504746, 5 pgs.
Final Rejection dated May 9, 2023, from the Korean Intellectual Property Office (KIPO), for Korean Patent Application No. 10-2021-7027871, 4 pgs.

* cited by examiner

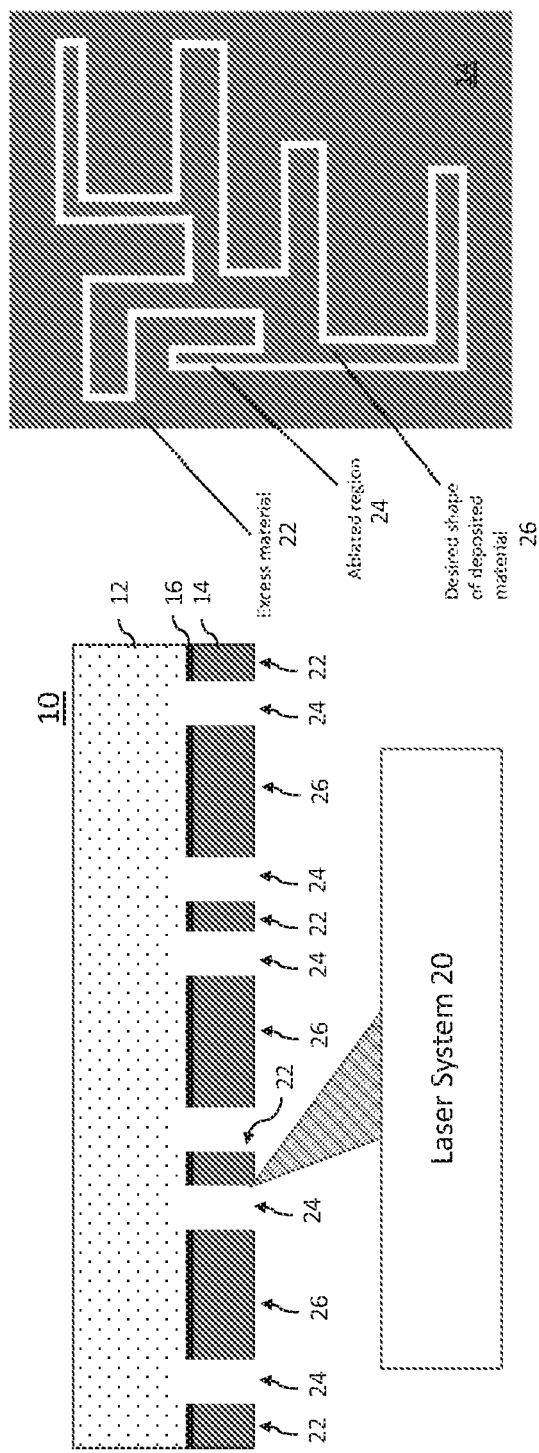

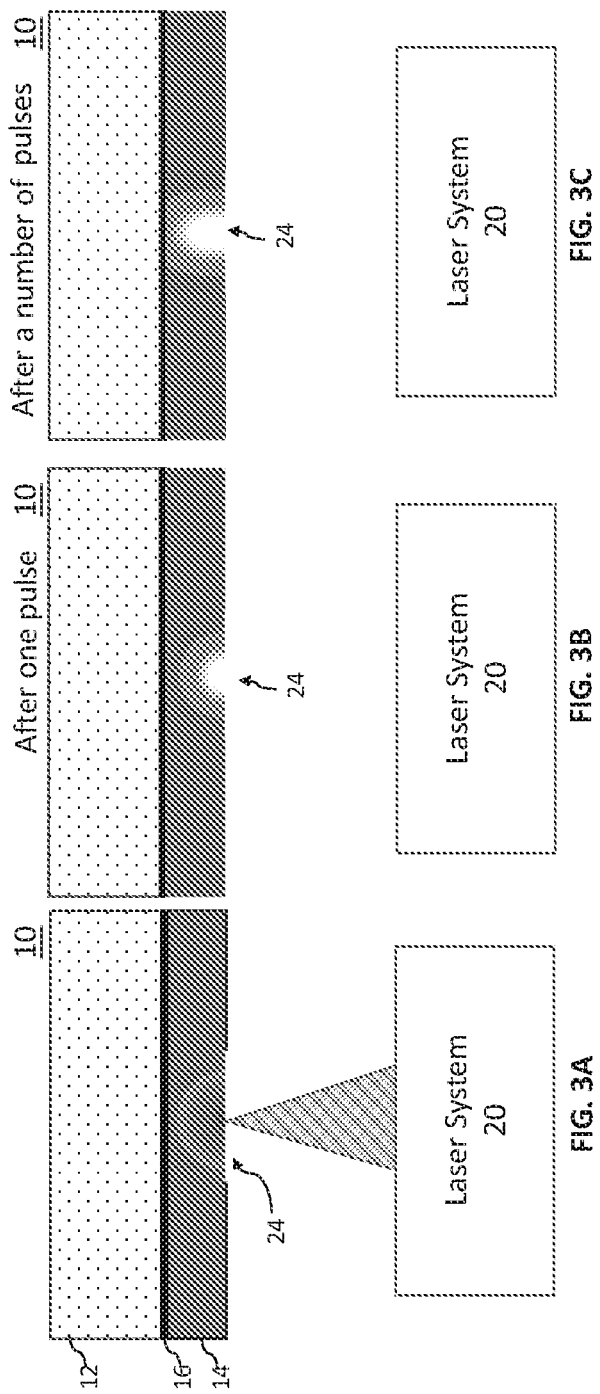

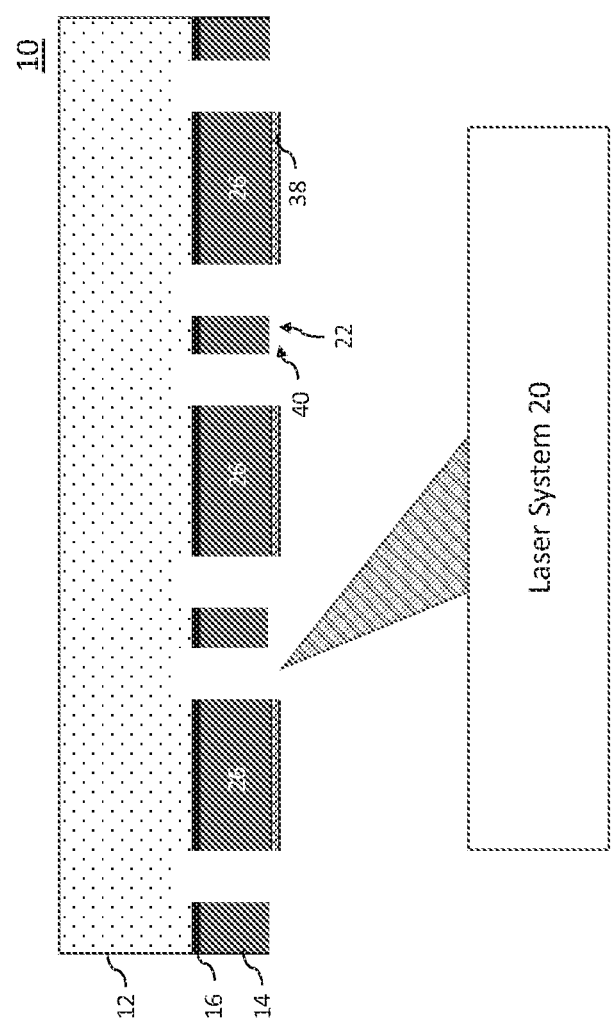

METHOD FOR TRANSFERRING A MATERIAL

RELATED APPLICATIONS

This application is a National Stage under 35 USC 371 of and claims priority to International Application No. PCT/IB2020/052703, filed 23 Mar. 2020, which claims priority to U.S. Provisional Application No. 62/823,087, filed 25 Mar. 2019.

FIELD OF THE INVENTION

The present invention relates to methods and apparatus for printing metal layers on a receiving medium in a desired geometry, and, in particular, such printing as employs selective release of portions of a metal layer coated on a foil to create a desired pattern on the receiving medium.

BACKGROUND

There are many challenges involved in depositing precise, thin layers of material on a substrate in a desired pattern, such as on a printed circuit board (PCB). Printing metal material on a substrate according to customary methods, such as photolithography, includes three steps: pre-treatment, pattern writing, and post-treatment. Digital patterning is a method used for direct writing of materials on a substrate.

Metal deposition, in general, is carried out by one of three main methods defined by the phase of the deposited material. In the first such method, atomic deposition, metal layers are grown by either thermal or plasma evaporation in vacuum or by electrolytic reduction of ionic metal in a solution. Such nonlocal deposition methods require complex pre- and post-treatment steps to define a 2D pattern, unlike digital patterning which is more straightforward. Moreover, as these steps involve wet treatments, they require a careful choice of the receiver substrate. In addition, as metal atoms are highly reactive with their environment, this method also poses demands for specific environmental conditions.

A second metal deposition method relies on various phases of nano- or micro-particles. These particles are less reactive than metallic atoms, and thus can be manipulated with less restrictions on the environment. Moreover, deposition of nanoparticles allows more flexibility in choosing the deposition method. Typically, when particles are used for metallization, two consecutive steps are involved: first printing/deposition of the particle, then a sintering step—a thermal/chemical process to fuse the particles together to form a solid metal. The specific printing and sintering methods depend on the particle matrix. Usually they are in the form of a liquid, aerosol, or powder. Using this metallic phase enables digital definition of the printed pattern. This is done using the selective printing and/or the selective sintering method. Most additive manufacturing (AM) methods for metals utilize nano- or micro-particles. The variants of this method are characterized by the specific choice of printing and sintering techniques used for manufacturing.

In the third method of metal printing, molten metal droplets are transferred from a bulk phase. One such process is a dispensing method, but this requires that the dispenser be made of a thermally resistant material selected according to the melting temperature of the metal to be transferred. Accordingly, this method favors the transfer of metals with a low melting temperature such as gallium alloys, solder, and aluminum. For metals with a higher melting point, these methods become more complex. Another limiting factor in dispensing processes is the size of the droplet. Molten metal exhibits high viscosity, and conventional dispenser technology makes it difficult to transfer small droplets with volumes below the pico-liter range. A different approach to printing metal droplets is the laser-induced forward transfer (LIFT) method. In the LIFT method, a focused laser beam is made incident on a thin layer of the printing material, causing a droplet to jet away from its original layer by local heating. Typically, the layer thickness is on the order of a few tens of nanometers. With the LIFT technique, metal microdroplets and sub-micrometer droplets can be printed directly from the bulk solid phase.

The main drawbacks of AM methods of printing metals can be traced back to the fracturing of the metal into the building blocks (e.g., atoms, nanoparticles, micro-particles, droplets) from which it is made, although this fracturing process is also essential for each respective AM process. A few examples of unwanted attributes due to such fracturing are: surface roughness, material density inhomogeneities (e.g., voids), and boundary formation between building blocks. Where the metal is being printed to form traces or tracks on a receiving substrate, such fracturing affects the physical properties of the printed track, including the electrical conductivity of the track as well as the electromagnetic reactivity. In addition, adhesion of the metal to different kinds of receivers is not guaranteed and so it is usually necessary to perform pre-processing.

SUMMARY OF THE INVENTION

The present invention provides apparatus and methods for printing metal on a receiving substrate in a desired geometry using a foil pre-coated with a layer of metal. The deposition process consists of three steps: laser ablation to define metal track geometry, followed by selective application of glue on the track on the substrate, and, finally, selective release of the metal track from the foil. To overcome drawbacks such as those described above, the proposed method uses a foil precoated with a metal layer with high conductivity and low roughness. The geometry of the deposited metal is defined using selective ablation of the desired pattern. The metal layer is then coated with adequate glue that guarantees adhesion on the receiver. Finally, selective release of the defined metal pattern, e.g., by laser irradiation, is performed.

One embodiment of the present invention begins with a transparent film that has been coated or laminated with a desired solid material, such as metal. In order to later deposit a desired shape of the material on a substrate, a laser system ablates a narrow strip of the material around this shape. This separates the material to be deposited from the excess material.

The material is then coated with a layer of ultraviolet (UV)-curable adhesive. In another embodiment of the invention, the glue can be applied before the ablation step. In still another embodiment, excess material is removed from the transparent film prior to application of the adhesive. The material is then brought into contact with a receiver substrate, and the adhesive is cured using a UV diode or UV laser. Care is taken to ensure that only the adhesive adjacent to the shape to be deposited is cured, guaranteeing that only the associated portion of the material will adhere to the substrate.

In various embodiments of the process, the adhesive may be cured through a transparent substrate. Alternatively, the UV-curable adhesive may be replaced with a heat-curable adhesive which is selectively cured using the heat from a laser. In still another embodiment, the UV-curable adhesive is replaced with a contact adhesive which is selectively cured by contact pressure. In still another embodiment, the UV-curable adhesive is selectively applied to only the desired areas of the material to be transferred to the receiver substrate and no subsequent removal of adhesive is necessary.

Once the material has been transferred to the receiving substrate, the film is peeled away from the substrate. As the film is peeled from the shape to be deposited, heat is applied selectively using a laser, breaking the bonds between the film itself and the material. The film is thus removed with the undesired material still attached to it, while the material that defines the desired shape for deposition remains attached to the substrate.

BRIEF DESCRIPTION OF THE DRAWINGS

The present invention is illustrated by way of example, and not limitation, in the figures of the accompanying drawings, in which:

FIGS. 2A and 2B provide side (2A) and plan (2B) views of ablation of a desired shape in a metal layer carried on a transparent substrate in accordance with embodiments of the present invention.

FIGS. 3A-3C illustrate further examples of ablation processes employable in accordance with embodiments of the present invention.

FIG. 5 illustrates an example of removal of portions of the adhesive from areas of the metal layer that are not to be transferred to the substrate in accordance with embodiments of the present invention.

DETAILED DESCRIPTION

The present invention provides apparatus and methods for printing material, e.g., a metal, on a receiving substrate in a desired geometry using a foil or other carrier pre-coated with a layer of the material to be printed. The deposition process generally involves laser ablation to define a material track geometry, selective application of glue on the track on the substrate, and, finally, selective release of the metal track from the foil. To overcome drawbacks such as those described above, embodiments of the invention use a foil precoated with a metal layer with high conductivity and low roughness. The geometry of the deposited metal is defined using selective ablation of the desired pattern. The metal layer is then coated with adequate glue that guarantees adhesion on the receiver. Finally, selective release of the defined metal pattern, e.g., by laser irradiation, is performed.

One embodiment of the present invention begins with a transparent film that has been coated or laminated with a desired solid material, such as metal. In order to later deposit a desired shape of the material on a substrate, a laser system ablates a narrow strip of the material around this shape. This separates the material to be deposited from any excess material.

The material is then coated with a layer of adhesive, for example a UV-curable adhesive. In another embodiment of the invention, the glue can be applied before the ablation step. The material is then brought into contact with a receiver substrate, and the adhesive is cured using a UV diode or UV laser. Care is taken to ensure that only the adhesive adjacent to the shape to be deposited is cured, guaranteeing that only the associated portion of the material will adhere to the substrate.

In various embodiments of the process, the adhesive may be cured through a transparent substrate. Alternatively, the UV-curable adhesive may be replaced with a heat-curable adhesive which is selectively cured using the heat from a laser. In still another embodiment, the UV-curable adhesive is replaced with a contact adhesive which is selectively cured by contact pressure. In still another embodiment, the UV-curable adhesive is selectively applied to only the desired areas of the material to be transferred to the receiver substrate and no subsequent removal of adhesive is necessary.

Once the material has been transferred to the receiving substrate, the film is peeled away from the substrate. As the film is peeled from the shape to be deposited, heat is applied selectively using a laser, breaking the bonds between the film itself and the material. The film is thus removed with the undesired material still attached to it, while the material that defines the desired shape for deposition remains attached to the substrate.

Figure 1A:
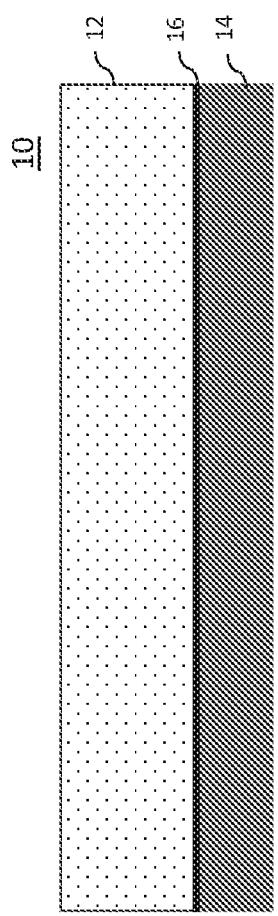
FIGS. 1A and 1B illustrate examples of material (e.g., metal) layers carried on transparent substrates for use in accordance with embodiments of the present invention.
Figure 1B:
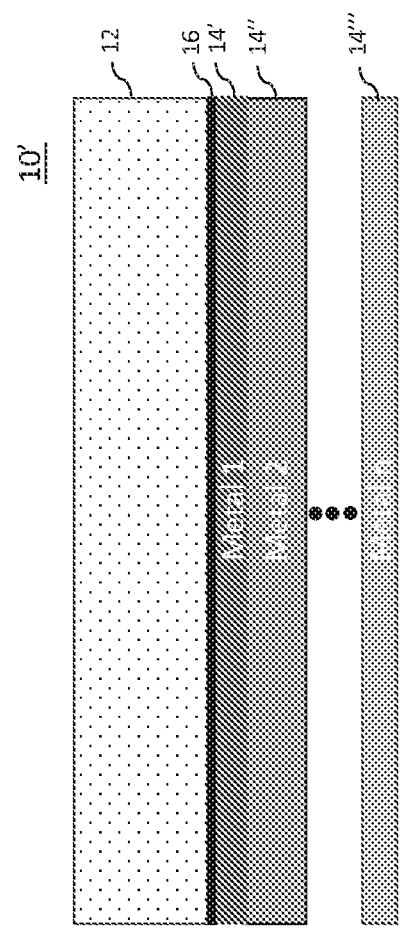

Referring now to FIG. 1A, a foil assembly 10 is illustrated. The foil assembly has a transparent substrate 12, e.g., a rigid material, such as glass, or a flexible material, such as a polyethylene terephthalate (PET)/polyethylene naphthalate (PEN) foil/polyimide foil (e.g., sold under the trade name KAPTON™), on which is laminated a material 14. In various embodiments, material 14 is a metal, e.g., copper, aluminum, silver, or other metal, but it may be another material for selective deposition on a receiving substrate. The material layer 14 is adhered to the substrate 12 by an adhesive 16. Although FIG. 1A illustrates a single material layer 16, as shown in FIG. 1B a foil assembly 10' may include a stack of n material layers 14', 14" . . . 14''', each of which may be a different material, or various materials may be repeated within the stack. The layers of materials within the stack may be adhered to one another, with the material layer 14' adjacent the substrate 12 adhered to the substrate by adhesive layer 16. For example, a stack of materials may include a first layer of copper (e.g., having a thickness of 10 µm-50 µm, and in one example 20 µm) coated by a layer of chrome or nickel (e.g., having a thickness of 0.5 µm-3 µm, and in one example 1 µm) to enhance the electrical contact of the material layer on a semiconductor substrate.

In general, material layers 14 (or stacks of materials layers) may have thickness in a range from 2 µm to 100 µm.

Material layers 14 (or stacks of materials layers) having thicknesses less than 2 µm may be used, however, care must be taken when releasing such a layer (as described below) so as to do so without damaging the very thin layer. Likewise, material layers 14 (or stacks of materials layers) thicker than 100 µm may be used but the ablation process (see below) will be slow and the edge quality of the released material may start to degrade. Consequently, it may be necessary to vary the irradiation time and/or conditions. In general, ablation times and energies (of the laser) will vary as a function of the material properties and/or laser light properties. Hereafter for convenience, the description will assume depositing of a single layer of material 14, however, the processes and apparatus described are equally applicable to depositing of stacks of materials layers.

FIGS. 2A and 2B and 3A-3C illustrate aspects of the ablation process to define a desired pattern of material for deposition on a receiving substrate. As shown in FIG. 2B, the desired pattern of material 14 to be deposited has an associated shape 26. This may be the shape of a trace for a printed circuit board, a patch antenna, a metal layer in a semiconductor device, etc. Through laser ablation of the material layer 14, the desired shape is traced out or contoured in the material layer, thus separating excess material 22 in the material layer from the desired shape of the material 26 by an ablated region 24. FIG. 2B shows in plan view how the desired shape of the material 26 is defined over the entirety of a material layer 14, while FIG. 2A illustrates such a segregation of desired portions of the material 14 from the excess material 22 in a side view.

As shown, the ablation is performed using a laser system 20. In one embodiment, a pulsed laser is used. As shown in FIGS. 3A-3C, laser light energy absorbed into the material layer 14 (FIG. 3A) heats the material until a portion of it is evaporated (FIG. 3B). By repeating the process several times, it is possible to ablate through the entire thickness of the material layer (FIG. 3C).

In different variations of the ablation process, pulse times for a given laser may be shortened or lengthened relative to one another. As the pulse time is made shorter, the contouring process becomes more precise, but slower. As the pulse time is made longer, the process becomes less precise, but the ablation is faster. For most applications the preferable pulse duration will vary between 0.1 ns to 2 ns. However, for thicker layers, longer pulses from 2 ns to 100 ns may be used. In the case of a high-resolution pattern below 10 µm width or/and special materials like silicone, plastic, or heat sensitive materials, a short pulse of pico-second or even femto-second duration could be used.

The scanning of the laser over the desired shape may be performed with an optical scanning system such as a galvanometer, polygon mirrors, resonate mirrors, MEMS mirrors, or other system. During the ablation process it is desirable (even necessary) to use an exhaust system to evacuate the ablated gas. Such evacuation reduces debris on the remaining metal layer 14 and improves the speed and quality of the ablation process.

Figure 4A:
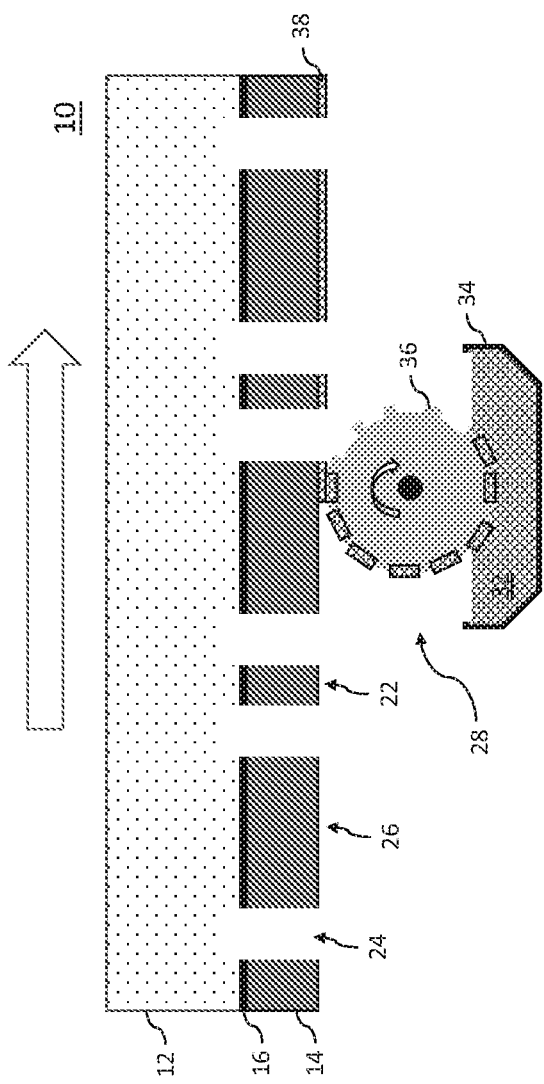
FIG. 4A illustrates one example of coating a metal layer with an adhesive in accordance with embodiments of the present invention.

Referring now to FIG. 4A, once the desired pattern of material to be deposited has been defined, the remaining portions of metal layer 14 are coated with a thin layer 38 (e.g., approximately 1 µm) of adhesive. Care is taken during this process so as not to deposit adhesive in any of the ablated regions 24. As shown in the illustration, one method of applying the coating of adhesive is to translate the foil assembly 10 relative to an applicator 28. As the foil assembly 10 passes by the applicator, the liquid or paste adhesive 32 from an associated container 34 is applied by brushes 36 or other implements, which are mounted on the perimeter of a rotating disc. A gravure coating is preferable because it enables deposition of thin layer 38 of adhesive only on the metal parts that contact the applicator 28 and enables a roll-to roll-process. Nevertheless, other coating methods such as slot-die deposition, rod coating, off-set printing, flexography, micro-spraying, and other coating methods could be used. So too could digital printing technology, such as inkjet printing or laser assisted deposition, be used to print on the desired areas and avoid the need for later ablation of the adhesive layer 38, as described further below.

In embodiments of the invention, different adhesives 32 may be used. Often, the selected adhesive will depend on the receiving substrate, with the adhesive being compatible with the specific receiver substrate. For example, for solar cell metallization the adhesive 32 could contain a glass frit to etch a dielectric layer (e.g., an antireflection/passivation coating of $SiO_2/SiN_x$) with a proper post-printing thermal treatment to enhance the contact resistance.

Referring to FIG. 5, once the adhesive layer 38 has been applied, a second ablation process is performed to remove adhesive from those portions of metal layer 14 that are not part of the desired pattern to be deposited on the receiving substrate. In some cases, this may be done by returning the foil assembly 10 to an ablation station that includes the same laser system 20 that was used to contour the desired shape of material in layer 14. This may involve rewinding a foil ribbon to reposition the area to be ablated, or translating a foil assembly 10 by an actuator, etc. In other instances, a separate ablation station may be employed. As shown in FIG. 5, the ablation of portions of adhesive layer 38 leaves voids 40 in which no adhesive is present. These voids correspond to sections of the metal layer 14 that comprise excess material 22.

Figure 2C:
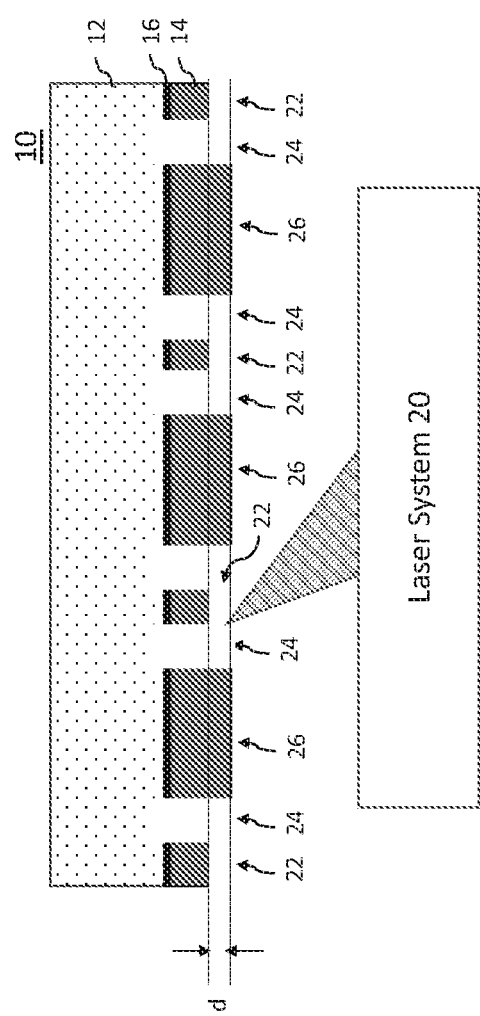
FIG. 2C illustrates an alternative embodiment in which excess or unwanted material is removed by ablation prior to application of an adhesive layer.
Figure 4B:
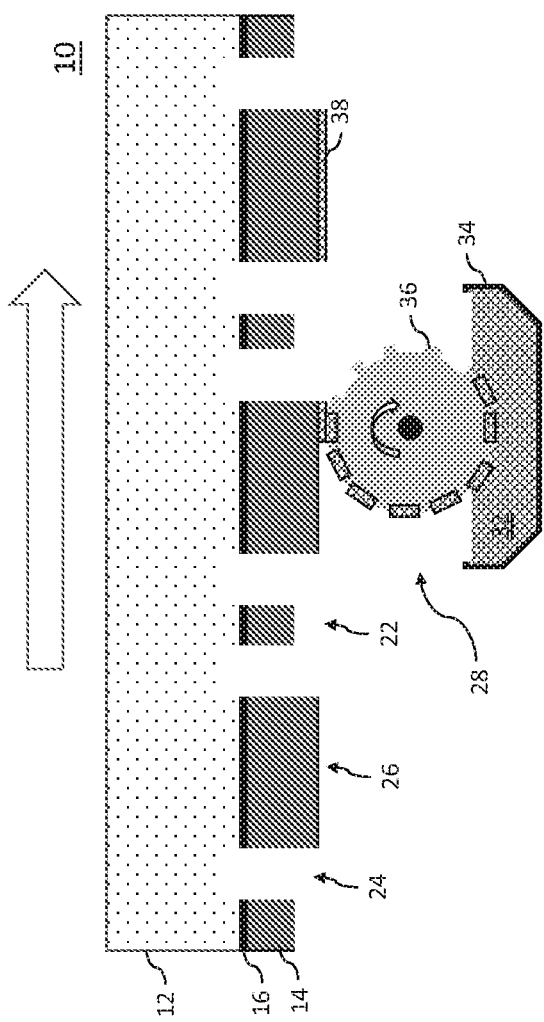
FIG. 4B illustrates an alternative example in which excess or unwanted material has removed by ablation prior to application of an adhesive layer as shown in FIG. 2C.

An alternative procedure is shown in FIGS. 2C and 4B. In FIG. 2C, prior to application of the adhesive layer, portions of excess or undesired material 22 in material layer 14 are removed by ablation to a desired depth "d" using laser system 20. Then, as shown in FIG. 4B, adhesive is applied only to the portions of material layer 14 that make up the desired pattern to be deposited 26.

In some embodiments, a UV-curable adhesive 32 may be used for adhesive layer 38. In such instances, the adhesive layer 38 may be selectively cured so that areas of unwanted glue are cured, for example, using a UV laser or a digital UV light projector (e.g., DLP digital light projector). The adhesive layer 38 also could be pre-coated on the material layer prior to ablation of the selected pattern and later selectively removed.

The adhesive 32 is applied so as to ensure good adhesion between the material layer 14 (i.e., the portions thereof that are associated with the desired pattern) and the receiving substrate. While in the above example the adhesive was applied as a layer 38 to the foil assembly 10, in other instances the adhesive 32 may be applied to the receiving substrate rather than the metal layer 14. Or, the adhesive may be associated with a tape that can be applied to either the metal layer 14 or the receiving substrate, for example a pre-applied layer of adhesive that can be exposed after the tape is secured to the metal layer 14 or the receiving substrate, or the adhesive may be applied to a tape after the tape is so secured.

Figure 6:
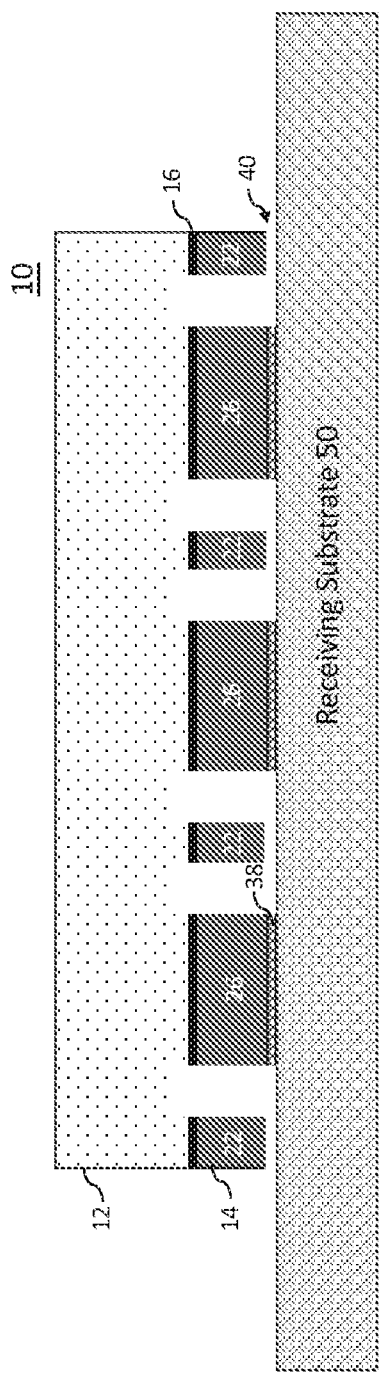
FIG. 6 illustrates transfer of the metal layer to a receiving substrate in accordance with embodiments of the present invention.

As shown in FIG. 6, once the adhesive layer 38 has been patterned so that it is coincident with the portions 26 of metal layer 14 defining the desired shape of the material to be deposited on the receiving substrate, the foil assembly 10 is brought into contact with the receiving substrate 50 and bonded thereto by virtue of the adhesive layer 38. This is necessary so as to avoid displacement of the material pattern during the laser release process described below.

The type of the adhesive used depends on the receiving substrate characteristics, the bond strength needed, and the application. By way of non-limiting example, the adhesive could be a pressure sensitive adhesive (PSA, with or without a liner, single coated, double coated, transfer type, or other type of PSA construction), a heat activated adhesive, a water activated adhesive, or another type of adhesive. Depending on the adhesive type, to achieve a good bond strength a high pressure could be applied during application, or a lower pressure for a longer period, or high temperature could be used. If the receiving substrate 50 is transparent, the adhesive could be a UV-activated adhesive that can be activated by a source of UV light during application of the foil assembly 10 to the receiving substrate 50.

The adhesive may be of any known chemistry, for example, an acrylic adhesive, a silicone adhesive, epoxy adhesive, polyurethane, natural adhesive, and others. In the case that the adhesive is applied directly to the receiving substrate or to a tape, the adhesive could be of any of the chemistries mentioned above, and could be applied in any known fashion, for examples as a spray coat, roll coat, spin coat, or other.

While the illustrated embodiments depict a planar surface, the receiving substrate 50 may have a non-planar surface to which the foil assembly is bonded. In such cases, the ablation must take into consideration the topology of the receiving substrate and the bonding of the metal layer 14 may need to be performed progressively over the length and/or width of the foil assembly 10 to avoid air bubbles becoming entrained between the metal layer 14 and the surface of the receiving substrate 50.

Figure 7:
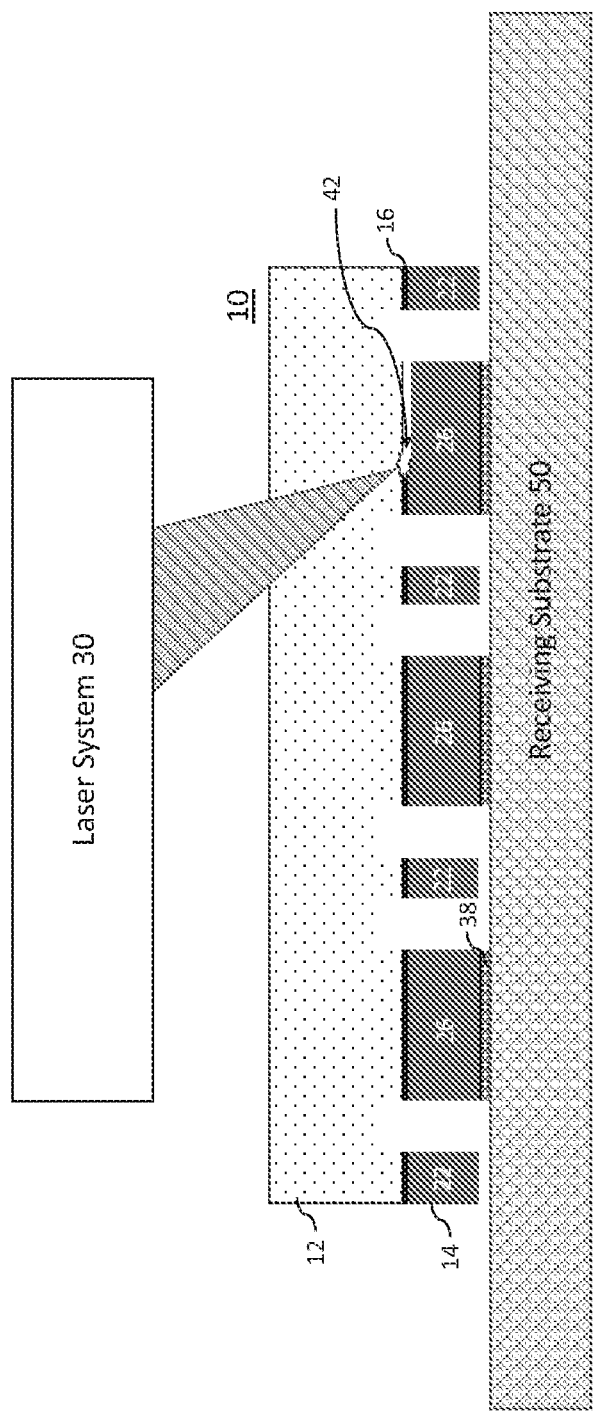
FIGS. 7 and 8 illustrate an example of laser induced release of the transferred metal layer to the receiving substrate in accordance with embodiments of the present invention.
Figure 8:
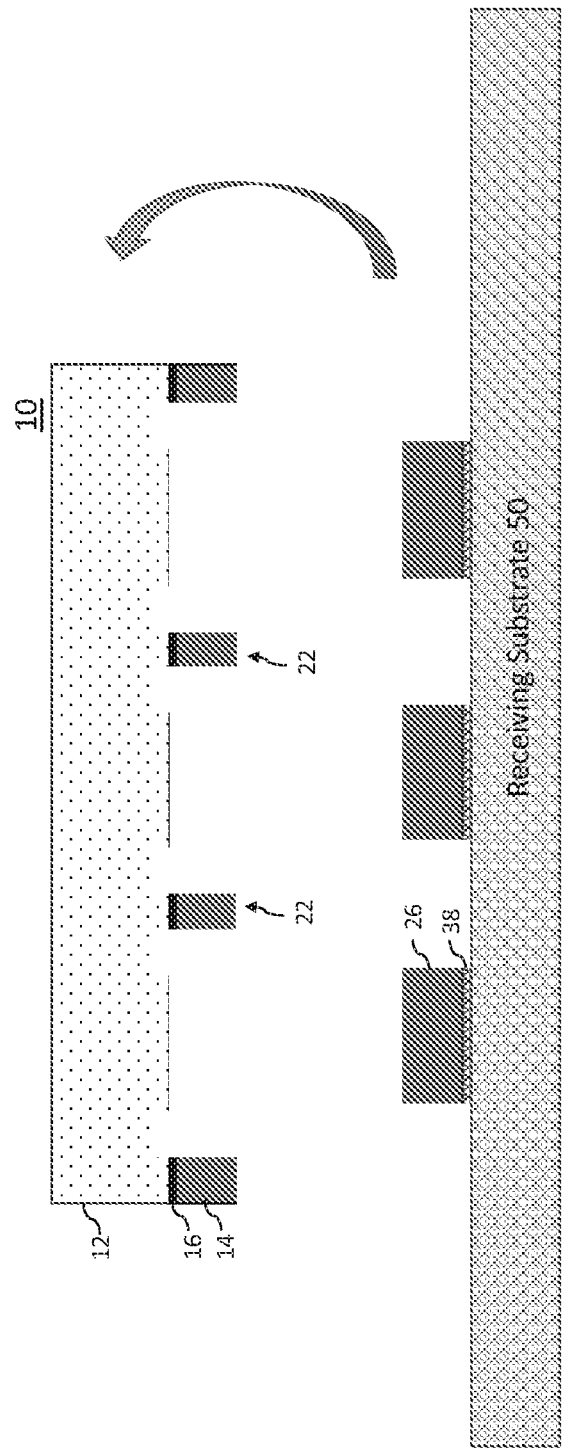

Referring now to FIGS. 7 and 8, once the foil assembly 10 has been bonded to the receiving substrate 50 by the adhesive layer 38, a laser system 30 may be used to release the material layer 14 from the substrate 12. In the case where substrate 12 is transparent, at least at wavelengths of the laser system 30, the laser beam can irradiate the adhesive layer 16 binding the material layer 14 to the substrate 12 through the substrate 12 itself. This irradiation is selective in that it is performed only for those portions 26 of material layer 14 that represent the desired shape of material to be deposited on the receiving substrate 50. Excess material 22 is not liberated from substrate 12 so that, as shown in FIG. 8, when the foil assembly 10 is separated from the receiving substrate 50, e.g., by peeling back the substrate 12 away from the receiving substrate 50, the portions of excess material 22 are removed as well. Of course, this action is not taken until all of the adhesive layer 16 binding the portions 26 of metal layer 12 that represent the desired shape of material to be deposited on the receiving substrate 50 has been removed. Removal of portions of the adhesive layer 16 in this fashion may be due to evaporating small amounts of material layer 14 associated with the portions 26 of material layer 14 that represent the desired shape of material to be deposited on the receiving substrate 50.

In some instances, this laser induced release (LIR) process may be performed concurrently with the physical separation of the foil assembly 10 from the receiving substrate 50. For example, as successive portions 26 of material layer 14 are liberated from substrate 12 through action of the laser system 30, a corresponding portion of the foil assembly 10 may be physically separated from the receiving substrate 50. In one embodiment of the invention, this is accomplished using a roll-to-roll process in which the foil assembly is transferred from one spool to another, through an LIR station. As the foil assembly passes through the LIR station and the successive portions 26 of material layer 14 are liberated from substrate 12, the released foil assembly continues onto a take up spool while the now separate portion of the receiving substrate with material portions 26 is diverted to a different path.

The laser system 30 depicted in FIG. 7 may be different than the laser system 20 discussed above in connection with the ablation process. Alternatively, in some embodiments, laser system 30 may be the same laser system used for the ablation process, in which case the foil assembly 10 and receiving substrate may need to be transported to a working area of laser system 20, or laser system 20, at least the laser beam, may need to be redirected to a work area associated with the irradiation of the adhesive layer 16.

Figure 9:
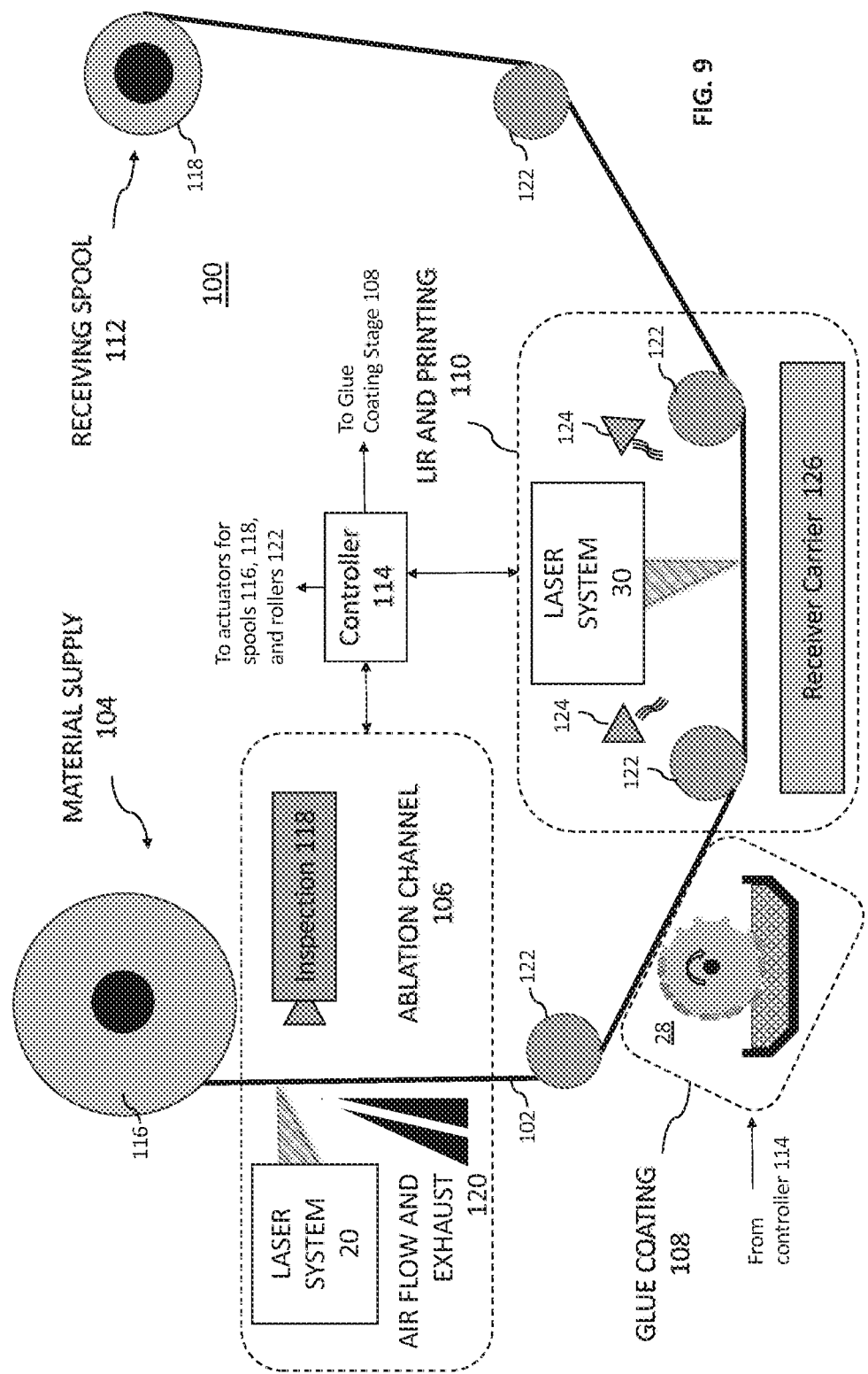
FIG. 9 illustrates an example of a system configured for printing metal layers on a receiving medium in a desired geometry in accordance with embodiments of the present invention.

Referring now to FIG. 9, one example of a system 100 for printing material on a receiving substrate in a desired geometry using an assembly, such as a foil, 102 pre-coated with a layer of material (such as a metal) is illustrated. System 100 is configured as a roll-to-roll system in which a foil 102 that is pre-coated with a layer of material is advanced from a material supply section 104, through an ablation channel 106, a glue coating state 108, and an LIR and printing stage 110. Following printing of material on a receiver, the foil 102 with remaining excess material bonded thereto is taken up on a receiving spool 112.

System 100 operates under the direction of a controller 114. In one embodiment, controller 114 includes a processor that executes computer-readable instructions (i.e., computer programs or routines) defining methods as described herein, which methods are instantiated and run on non-transitory computer-readable media. Such processes may be rendered in any computer language and executed on any suitable programmable logic hardware. Processor-based controller 114 upon or with which the methods of the present invention may be practiced will typically include a bus or other communication mechanism for communicating information; a main memory, such as a RAM or other dynamic storage device, coupled to the bus for storing information and instructions to be executed by the processor and for storing temporary variables or other intermediate information during execution of instructions to be executed by the processor; and a ROM or other static storage device coupled to the bus for storing static information and instructions for the processor. A storage device, such as a hard disk or solid-state drive, may also be included and coupled to the bus for storing information and instructions. The subject controller may, in some instances, include a display coupled to the bus for displaying information to a user. In such instances, an input device, including alphanumeric and/or other keys, may also be coupled to the bus for communicating information and command selections to the processor. Other types of user input devices, such as cursor control devices may also be included and coupled to the bus for communicating direction information and command selections to the processor and for controlling cursor movement on the display.

The controller 114 may also include a communication interface coupled to the processor, which provides for two-way, wired and/or wireless data communication to/from the controller, for example, via a local area network (LAN). The communication interface sends and receives electrical, electromagnetic, or optical signals which carry digital data streams representing various types of information. For example, the controller 114 may be networked with a remote unit (not shown) to provide data communication to a host computer or other equipment operated by a user. The controller can thus exchange messages and data with the remote unit, including diagnostic information to assist in troubleshooting errors, if needed.

In operation, system 100 may be used for printing materials such as metals on a receiving substrate and in a desired geometry in the manner described above. For example, using foil 102 that is pre-coated with a layer of material, controller 114 operates the material supply spool 116 and take up spool 118 to advance the foil through the various stages of the deposition process: First, in laser ablation channel 106, laser system 20 is used to define the desired material pattern geometry, as discussed above in connection with FIGS. 2A and 2B and 3A-3C. Through laser ablation of a material layer on foil 102, the desired shape for deposition is traced out or contoured. The laser used for the ablation process may be a pulsed laser, and laser light energy absorbed into the material layer of the foil heats the material until a portion of it is evaporated. The laser system 20 ablates a narrow strip of the material layer around the desired shape to be deposited, separating the material to be deposited from any excess material.

As shown, the ablation process may be observed using an inspection system 118, such as one or more cameras. The camera(s) may image the ablation process in the visible spectrum and/or the infra-red spectrum, and the imaging data may be provided as feedback to controller 114 to operate the laser system 20 accordingly. For example, using the imaging data, controller 114 may adjust the pulse durations and/or frequencies of laser system 20 so as to provide selective control over the ablation of the material layer on foil 102. As mentioned above, proper air flow and exhaust of the ablation channel 106 is maintained so as to evacuate the material vapor.

Following the ablation process, the foil 102 is advanced via more or more rollers 122 and spools 116, 118, to the glue coating stage 108. As described with reference to FIG. 4 above, selective application of a UV-curable adhesive on the material layer of foil 102 is performed at this stage. As noted, in some embodiments of the invention, the adhesive can be applied before the ablation step.

From the glue coating stage 108, the foil is advanced to the LIR and printing stage 110. Here, selective release of the defined material pattern, e.g., by laser irradiation, is performed. During the LIR process, the material of the foil 102 is brought into contact with a receiver substrate on a receiver carrier 126, and the adhesive applied in glue coating stage 108 may be cured using one or more UV diodes, a UV laser, or other UV source(s) 124, or other means as discussed above. Controller 114 is programmed to cause the laser system 30 to emit pulses, thereby releasing the desired portions of the material layer of foil 102. Excess material of the foil 102 is not deposited, so that when the foil 102 is separated from the receiving substrate, e.g., by peeling the foil away, and taken up on spool 118, the portions of excess material are removed as well. The material coated receiving substrate may be removed from the receiver carrier 126 and new receiving substrate introduced for printing. Although not shown, as in ablation channel 106, one or more inspection cameras may be employed to monitor the deposition process and provide feedback in the form of imaging data to controller 114 for refining operation of the LIR and printing stage.

While system 100 is described as using a roll-to-roll process for a material foil, in the case where other material carrying forms are used, e.g., a rigid substrate coated with a material layer, a robotic handing system may be used. For example, the material coated substrate may be moved between ablation channel 106, glue coating station 108 and LIR and printing stage 110 using a robotic arm with end effectors to appropriately position the substrate. Following printing of the material on a receiving substrate, the carrier substrate that remains coated with excess material may be removed from the LIR and printing stage, again by robotic arms, and recycled by removal of the excess material and recoating of a layer of material.

Thus, methods and apparatus for printing material layers on a receiving medium in a desired geometry, and, in particular, such printing as employs selective release of portions of a metal layer coated on a foil to create a desired pattern on the receiving medium have been described. In one embodiment of the invention, a material (e.g., a metal) is printed on a receiving substrate in a desired geometry by laser ablating an assembly pre-coated with a layer of the material to define a desired material geometry. An adhesive is selectively applied on the desired material. The desired material may then be selectively released from the assembly onto the receiving substrate by bonding the desired material to the receiving substrate, laser irradiating the desired material, and removing excess material from the receiving substrate. In some cases, the assembly includes a transparent substrate (e.g., a transparent film), in which case the excess material may be removed from the receiving substrate by peeling away the transparent substrate with the excess material adhered thereto. In the above example, the adhesive is selectively applied on the desired material after laser ablating the assembly, however, in some instances the adhesive is selectively applied on the desired material before the assembly is laser ablated. In various embodiments, bonding the desired material to the receiving substrate generally includes bringing the desired material into contact with the receiving substrate. If the adhesive is a UV-curable adhesive, bonding further includes UV-curing the adhesive prior to laser irradiating the desired material. Alternatively, if the adhesive is a contact adhesive or a heat-curable adhesive, curing may be by contact pressure or heat, respectively.

A further embodiment of the invention, an apparatus for printing material (e.g., a metal) on a receiving substrate in a desired geometry includes a laser ablation stage, for ablating a layer of the material coated on a carrier substrate (e.g., a transparent substrate such as a transparent film) to define a desired material geometry; an adhesive application stage, for applying an adhesive on the desired material; and a printing stage, for selectively releasing the desired material from the carrier substrate onto the receiving substrate by bonding the desired material to the receiving substrate, laser irradiating the desired material, and removing excess material from the receiving substrate. The printing stage may be configured to remove the excess material from the receiving substrate by peeling away the transparent substrate with the excess material adhered thereto. In various embodiments, the adhesive application stage may be arranged after the laser ablation stage in the direction of travel of the receiving substrate through the apparatus so that selective application of the adhesive on the desired material occurs after laser ablation of the layer of material, or the adhesive application stage may be arranged before the laser ablation stage in the direction of travel of the receiving substrate through the apparatus so that selective application of the adhesive on the desired material occurs before laser ablation of the layer of material. The printing stage may also be configured to bond the desired material to the receiving substrate by bringing the desired material into contact with the receiving substrate. Where the adhesive is a UV-curable adhesive, the printing stage may be further configured to UV-cure the adhesive with one or more UV sources prior to laser irradiating the desired material. Where the adhesive is a contact adhesive or a heat-curable adhesive, curing may be by contact pressure or heat, respectively.

Still another embodiment of the invention provides for printing material (e.g., a metal) on a receiving substrate in a desired geometry by laser ablating an assembly (which may include a transparent substrate such as a transparent film) pre-coated with a layer of the material to define a desired material geometry and removing excess material from the assembly; selectively applying an adhesive on the desired material; and selectively releasing the desired material from the assembly onto the receiving substrate by bonding the desired material to the receiving substrate and laser irradiating the desired material. Generally, bonding the desired material to the receiving substrate involves bringing the desired material into contact with the receiving substrate and, where the adhesive is a UV-curable adhesive, UV-curing the adhesive prior to laser irradiating the desired material. Alternatively, where the adhesive is a contact adhesive or heat-curable adhesive, curing may be by contact pressure or heat, respectively.

What is claimed is:

1. A method for printing material on a receiving substrate in a desired geometry, the method comprising:
    laser ablating an assembly pre-coated with a material layer made of metal to define a desired portion of the material layer, wherein the desired portion is traced out or contoured in the material layer by separating excess material in the material layer from the desired portion by an ablated region;
    applying an adhesive on the desired portion and the excess material;
    laser ablating to remove the adhesive from the excess material;
    selectively releasing the desired portion from the assembly onto the receiving substrate by bonding the desired portion to the receiving substrate, laser irradiating the desired portion, and removing the assembly together with the excess material from the receiving substrate;
    imaging, by a camera, the laser ablation of the assembly pre-coated with the material layer made of metal to generate imaging data; and
    adjusting, by a controller and using the imaging data, one or more of a pulse duration or frequency of a laser system used to perform the laser ablation of the assembly pre-coated with the material layer made of metal so as to provide selective control over an ablation of the material layer.

2. The method of claim 1, wherein the assembly comprises a transparent substrate and removing the excess material from the receiving substrate comprises peeling away the transparent substrate with the excess material adhered thereto from the receiving substrate.

3. The method of claim 2, wherein the transparent substrate comprises a transparent film.

4. The method of claim 1, wherein bonding the desired portion to the receiving substrate comprises bringing the desired portion into contact with the receiving substrate and ultraviolet (UV)-curing the adhesive prior to laser irradiating the desired portion.

5. The method of claim 1, wherein bonding the desired portion to the receiving substrate comprises bringing the desired portion into contact with the receiving substrate and the adhesive comprises one of a contact adhesive or a heat-curable adhesive.

6. A method for printing material on a receiving substrate in a desired geometry, the method comprising:
    laser ablating an assembly pre-coated with a material layer made of metal to define a desired portion of the material layer, wherein the desired portion is traced out or contoured in the material layer by separating excess material in the material layer from the desired portion by an ablated region;
    applying an adhesive on the desired portion and the excess material;
    laser ablating to remove the adhesive from the excess material; and
    after the adhesive has been removed from the excess material by the laser ablation, selectively releasing the desired portion from the assembly onto the receiving substrate by bonding the desired portion to the receiving substrate, laser irradiating the desired portion, and removing the assembly together with the excess material from the receiving substrate.

7. The method of claim 6, wherein the assembly comprises a transparent substrate and removing the excess material from the receiving substrate comprises peeling away the transparent substrate with the excess material adhered thereto from the receiving substrate.

8. The method of claim 7, wherein the transparent substrate comprises a transparent film.

9. The method of claim 6, wherein bonding the desired portion to the receiving substrate comprises bringing the desired portion into contact with the receiving substrate and ultraviolet (UV)-curing the adhesive prior to laser irradiating the desired portion.

10. The method of claim 6, wherein bonding the desired portion to the receiving substrate comprises bringing the desired portion into contact with the receiving substrate and the adhesive comprises one of a contact adhesive or a heat-curable adhesive.

* * * * *